(12) United States Patent  
Chen et al.

(10) Patent No.: US 9,349,710 B2  
(45) Date of Patent: May 24, 2016

(54) CHIP PACKAGE AND METHOD FOR FORMING THE SAME

(71) Applicant: XINTEC INC., Jhongli, Taoyuan County (TW)

(72) Inventors: Chien-Hui Chen, Zhongli (TW); Tsang-Yu Liu, Zhubei (TW); Chun-Wei Chang, New Taipei (TW); Chia-Ming Cheng, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/504,319

(22) Filed: Oct. 1, 2014

(65) Prior Publication Data

US 2015/0097299 A1 Apr. 9, 2015

Related U.S. Application Data

(60) Provisional application No. 61/887,700, filed on Oct. 7, 2013.

(51) Int. Cl.
| | |
|---|---|
| *H01L 21/50* | (2006.01) |
| *H01L 25/065* | (2006.01) |
| *H01L 21/683* | (2006.01) |
| *H01L 23/00* | (2006.01) |

(52) U.S. Cl.
CPC ........ *H01L 25/0655* (2013.01); *H01L 21/6835* (2013.01); *H01L 23/562* (2013.01); *H01L 23/564* (2013.01); *H01L 2221/68327* (2013.01); *H01L 2924/0002* (2013.01)

(58) Field of Classification Search  
USPC ......................................................... 257/777  
See application file for complete search history.

(56) References Cited

U.S. PATENT DOCUMENTS

| | | | | |
|---|---|---|---|---|
| 6,488,154 | B1 * | 12/2002 | Yeh .................... | H01L 21/67333 206/503 |
| 2006/0006531 | A1 * | 1/2006 | Lin ......................... | H01L 24/10 257/737 |
| 2007/0257361 | A1 * | 11/2007 | Hsu ...................... | H01L 23/5389 257/734 |
| 2007/0269931 | A1 * | 11/2007 | Chung et al. .................. | 438/109 |
| 2009/0246938 | A1 * | 10/2009 | Kim .............................. | 438/462 |
| 2012/0111492 | A1 * | 5/2012 | Diep et al. ..................... | 156/247 |

FOREIGN PATENT DOCUMENTS

JP 04-116950 4/1992

* cited by examiner

*Primary Examiner* — Thao P Le  
(74) *Attorney, Agent, or Firm* — Liu & Liu

(57) ABSTRACT

A method for forming a chip package is provided. A first substrate is provided. A second substrate is attached on the first substrate, wherein the second substrate has a plurality of rectangular chip regions separated by a scribed-line region. A portion of the second substrate corresponding to the scribed-line region is removed to form a plurality of chips on the first substrate, wherein at least one bridge portion is formed between adjacent chips. A chip package formed by the method is also provided.

20 Claims, 8 Drawing Sheets

CHIP PACKAGE AND METHOD FOR FORMING THE SAME

CROSS REFERENCE TO RELATED APPLICATIONS

This application claims the benefit of U.S. Provisional Application No. 61/887,700, filed on Oct. 7, 2013, the entirety of which is incorporated by reference herein.

BACKGROUND OF THE INVENTION

1. Field of the Invention

The invention relates to semiconductor package technology, and in particular to a chip package and methods for forming the same.

2. Description of the Related Art

The chip packaging process is an important step in the fabrication of an electronic product. Chip packages not only protect the chips therein from outer environmental contaminants, but they also provide electrical connection paths between electronic elements inside and those outside of the chip packages.

Manufacturing processes of chip packages comprise dicing a wafer substrate, which is attached to a carrier wafer, into a plurality of chips. The carrier wafer and the chips thereon are then disposed on pins in deposition equipment. Next, the pins are lowered, such that the carrier wafer is completely loaded on a work surface of the equipment to perform a deposition process on the chips, such as depositing an oxide layer on the chips.

However, vacuum gaps are formed between portions of the carrier wafer, which are previously supported by the pins of the deposition equipment, and the underlying pins. Namely, the portions of the carrier wafer previously supported by the pins are not in contact with the work surface of the equipment. Therefore, the overlying chips adjacent to the vacuum gaps have poor thermal conduction during the deposition process. As a result, the thickness of the oxide layer, which is subsequently formed on the chips, is non-uniform, thereby affecting the quality of the chip packages.

Thus, there exists a need in the art for development of a chip package and methods for forming the same capable of mitigating or eliminating the aforementioned problems.

BRIEF SUMMARY OF THE INVENTION

An embodiment of the invention provides a method for forming a chip package comprising providing a first substrate. A second substrate is attached on the first substrate, wherein the second substrate has a plurality of rectangular chip regions separated by a scribed-line region. A portion of the second substrate corresponding to the scribed-line region is removed to form a plurality of chips on the first substrate, wherein at least one bridge portion is formed between adjacent chips.

An embodiment of the invention provides a chip package comprising a first substrate. A plurality of rectangular chips is attached on the first substrate. At least one bridge portion is formed between adjacent chips.

Another embodiment of the invention provides a chip package comprising a rectangular chip. At least one protruding portion extends outward from a corner of the chip.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, microactuators, surface acoustic wave devices, pressure sensors, ink printer heads, and so on.

The above-mentioned wafer-level package process mainly means that after the package step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by stacking a plurality of wafers having integrated circuits.

Figure 1A:
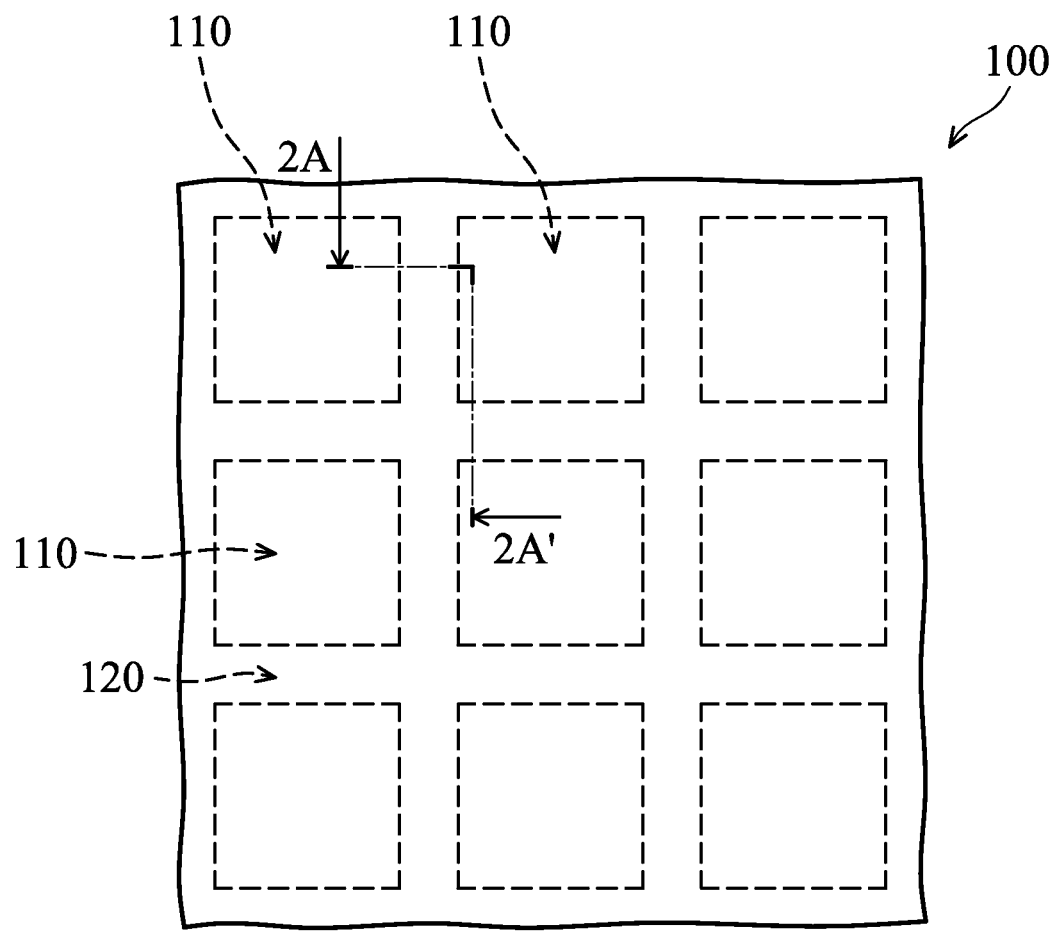
FIGS. 1A-1D are plan views of an exemplary embodiment of a method for forming a chip package according to the invention.
Figure 1B:
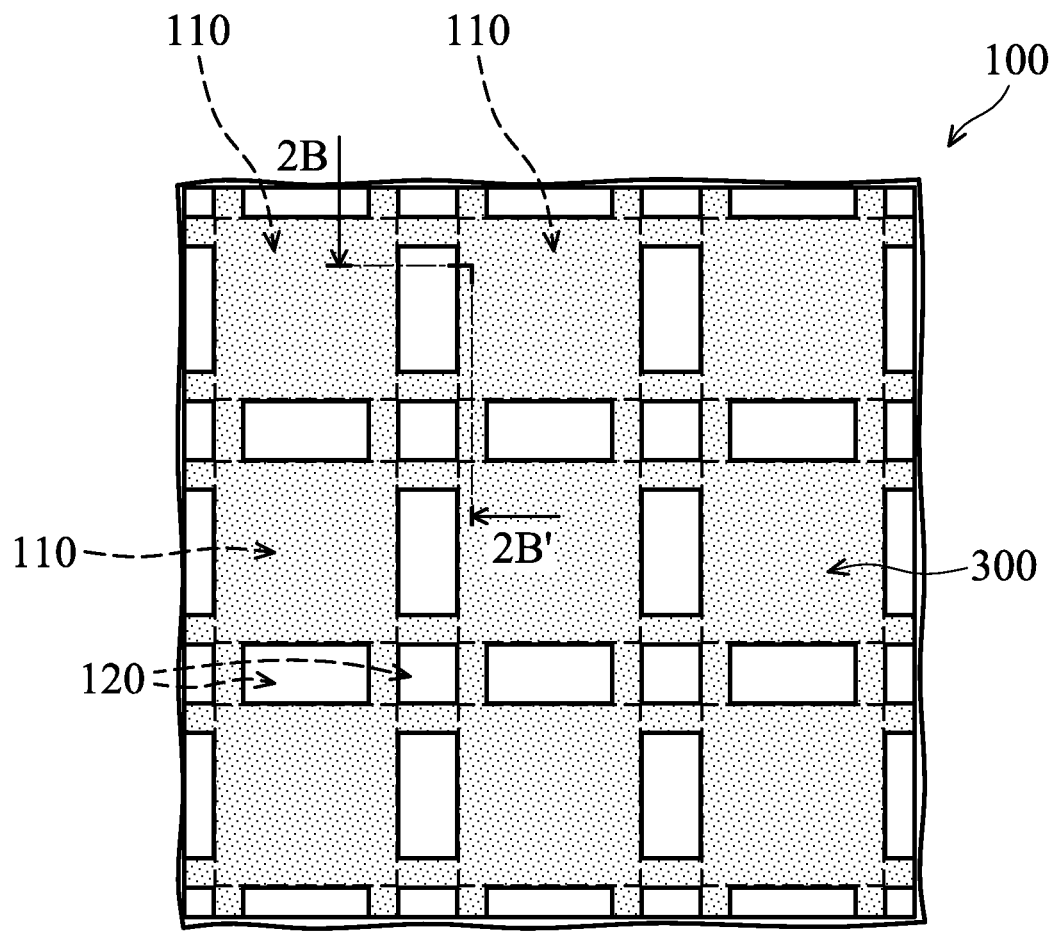
Figure 1C:
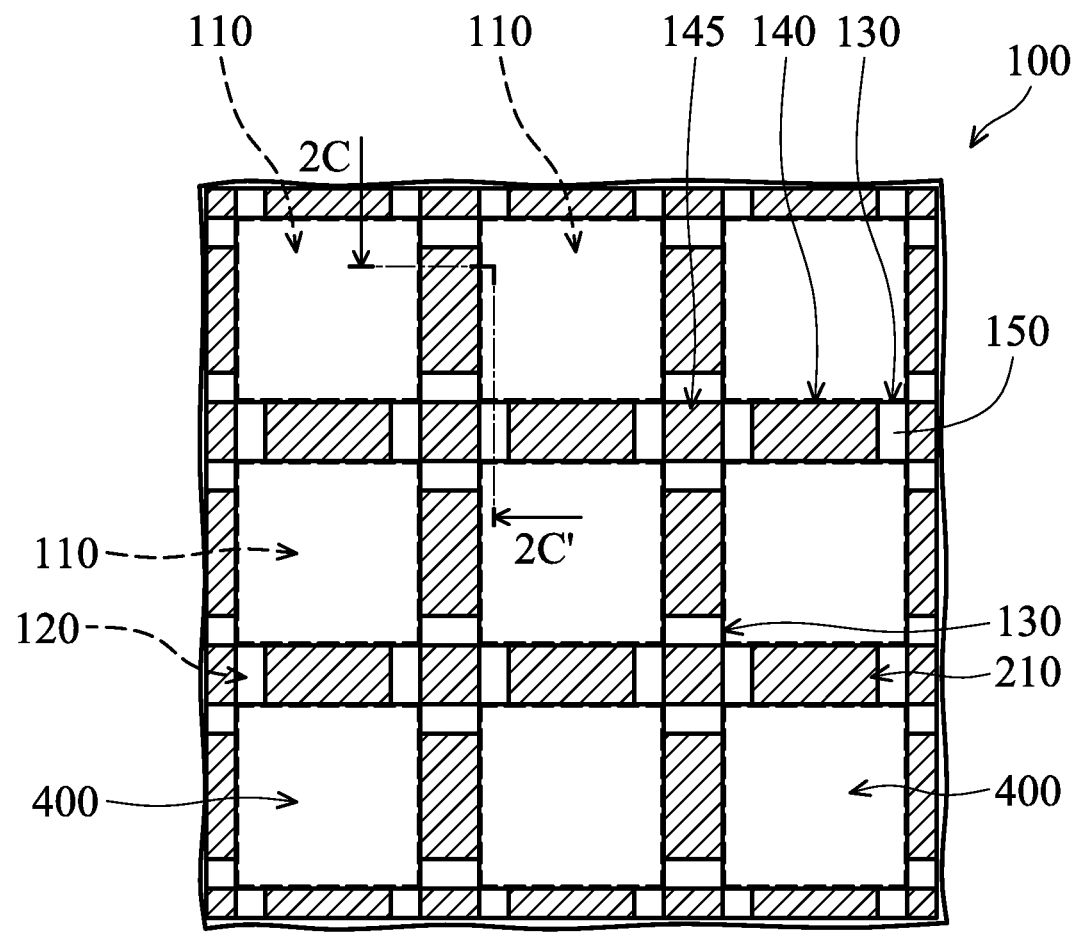
Figure 1D:
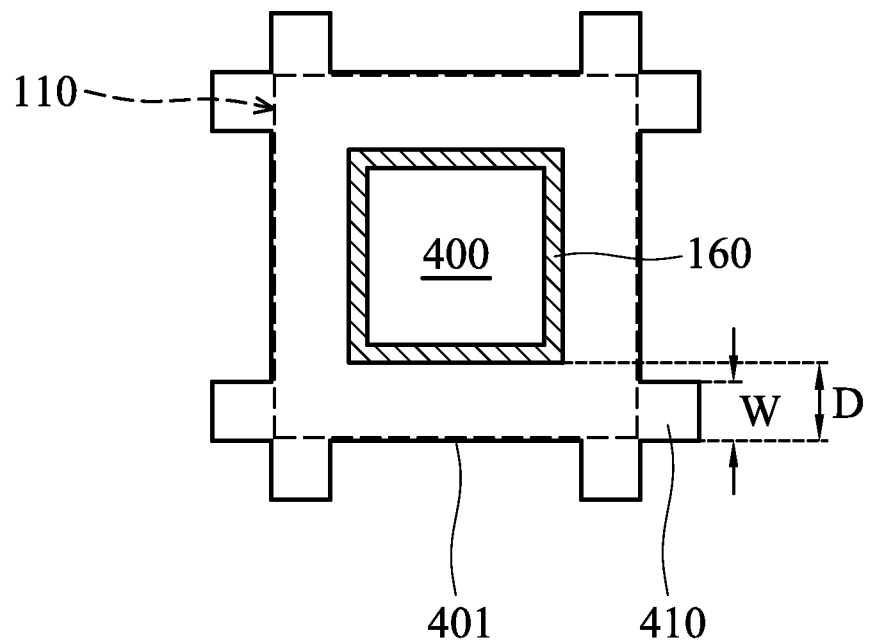
Figure 2A:
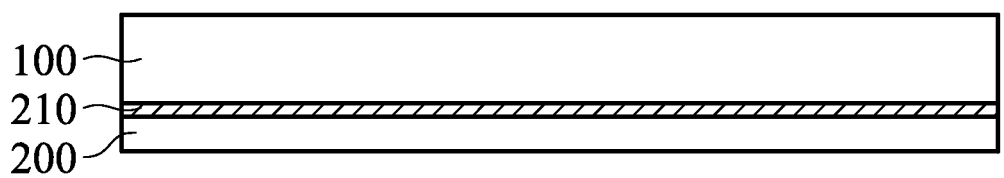
FIGS. 2A, 2B and 2C are cross-sectional views along the line 2A-2A' in FIG. 1A, the line 2B-2B' in FIG. 1B and the line 2C-2C' in FIG. 1C, respectively.
Figure 2B:
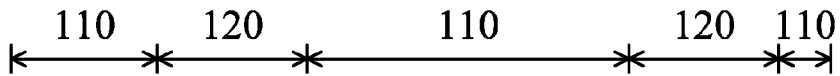
Figure 2B:
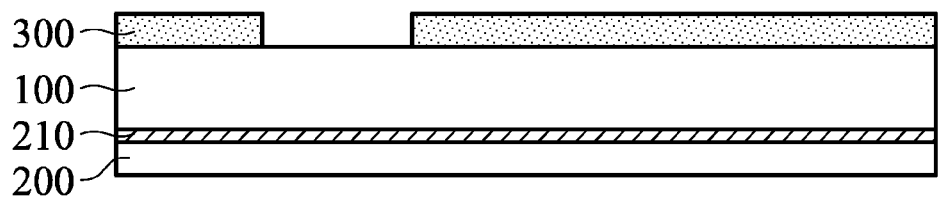
Figure 2C:
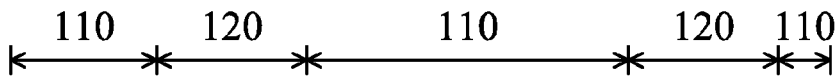
Figure 2C:
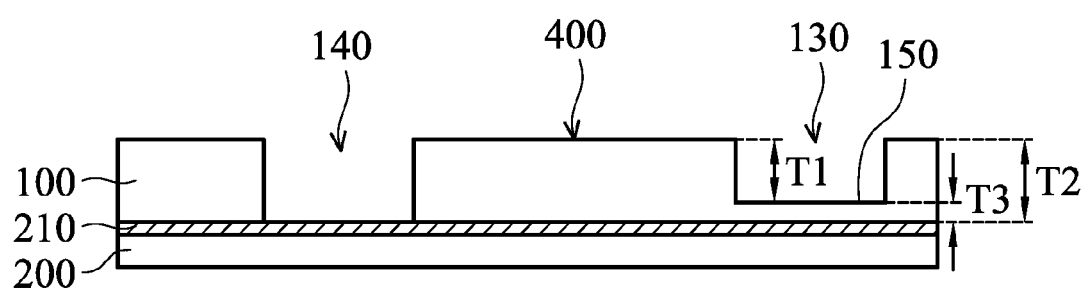

An exemplary embodiment of a method for forming a chip package according to the invention is illustrated with FIGS. 1A-1D and 2A-2C, in which FIGS. 1A-1D are plan views of an exemplary embodiment of a method for forming a chip package according to the invention and FIGS. 2A, 2B and 2C are cross-sectional views along the line 2A-2A' in FIG. 1A, the line 2B-2B' in FIG. 1B and the line 2C-2C' in FIG. 1C, respectively.

Referring to FIGS. 1A and 2A, a first substrate 200 is provided. The first substrate 200 may be a raw semiconductor substrate, a glass substrate or another suitable carrier substrate. In the embodiment, a second substrate 100 is attached to the first substrate 200 by an adhesion layer 210. The second substrate 100 may be a semiconductor wafer, such as a silicon wafer which is suitable for wafer-level packaging. Forming chip packages by wafer-level packaging can reduce the processing cost and time. The second substrate 100 has a plurality of rectangular chip regions 110 separated by a scribed-line region 120. In one embodiment, each chip region 110 comprises a device region (not shown) which may comprise an optoelectronic device, such as image-sensor elements or light-emitting elements, or another electronic device, such as micro-electro-mechanical systems, microfluidic systems, physical sensors, solar cells, RF circuits, accelerators, gyroscopes, microactuators, surface acoustic wave devices, pressure sensors, ink printer heads or power-chip modules.

Next, a photoresist material layer (not shown) is formed on the second substrate 100 by a deposition process and a patterned mask layer 300 is then formed by a lithography process, such as performing exposure and development processes on the photoresist material layer. The patterned mask layer 300 exposes portions of the second substrate 100 corresponding to the scribed-line region 120, as shown in FIGS. 1B and 2B.

Next, the portions of the second substrate 100 corresponding to the scribed-line region 120 are removed by performing an etching process, such as a dry etching process, a wet etching process, a plasma etching process, a reactive ion etching process or another suitable etching process, using the patterned mask layer 300 on the second substrate 100. As a result, a plurality of rectangular chips 400 is formed on the first substrate 200 and bridge portions 150 are formed between adjacent chips 400. The patterned mask layer 300 is then removed, as shown in FIGS. 1C and 2C.

During the described etching process, a plurality of first openings 130, a plurality of second openings 140 and a plurality of third openings 145 are formed in the second substrate 100 corresponding to the scribed-line region 120. The first openings 130 have a depth T1 less than a thickness T2 of the second substrate 100, i.e. the first openings 130 do not penetrate the second substrate 100, while the second openings 140 and the third openings 145 penetrate the second substrate 100 thereby exposing the adhesion layer 210 under the second substrate 100, as shown in FIG. 2C. The first openings 130, the second openings 140 and the third openings 145 in the scribed-line region 120 are connected to each other, such that the second substrate 100 is separated into the plurality of chips 400. Moreover, portions of the second substrate 100, which remain under the first openings 130, form a plurality of bridge portions 150 between the adjacent chips 400, as shown in FIG. 1C. In other embodiments, only one bridge portion 150 may be formed between two adjacent chips 400.

In the described etching process, the etching depth of the second substrate 100 corresponding to the scribed-line region 120 can be adjusted by changing the size of the patterning openings of the mask layer 300, which corresponds to the second openings 140 and the third openings 145 (i.e. the etching depth can also be adjusted by changing the size of patterns of the mask layer 300 corresponding to the first openings 130). For example, the size of the patterns of the mask layer 300 corresponding to the first openings 130 can be reduced to increase the depth of the first openings 130. Namely, the thickness of the bridge portions 150 under the first openings 130 is reduced.

In the embodiment, each corner of each of the adjacent chips 400 connects to two bridge portions 150 and an edge of each of the adjacent chips 400 connects to two bridge portions 150, as shown in FIG. 1C. The thickness T3 of the bridge portions 150 is less than the thickness T2 of the second substrate 100, as shown in FIG. 2C, thereby facilitating the subsequent singulation process. In the embodiment, the depth T1 may be equal to or greater than 0. When the depth T1 is equal to 0, the thickness T3 of the bridge portions 150 is equal to the thickness T2 of the second substrate 100. In the embodiment of FIGS. 1C and 2C, the chips 400 separated by the scribed-line region 120 are substantially aligned in an array. There are two bridge portions 150 between the adjacent chips 400 in the same row, and there are two bridge portions 150 between the adjacent chips 400 in the same column. It should be realized that the number, top-view contour and position of the bridge portions 150 shown in FIGS. 1C and 2C are illustrated as an example and they are not limited thereto. The actual number, top-view contour and position of the bridge portions 150 are determined by design demands.

In the embodiment, after separating the second substrate 100 into the plurality of chips 400 having the bridge portions 150, the method for forming a chip package further comprises disposing the first substrate 200 and the chips 400 thereon into a deposition equipment (not shown) so as to form an insulating layer (not shown), such as oxide, nitride or another suitable dielectric material, as an insulating coating on the surface of the chips 400.

In one embodiment, the chips 400 comprise a seal ring 160 (shown in FIG. 1D), which is adjacent to edges of the device regions (not shown) of the chips 400. When the subsequent dicing process is performed along the scribed-line region 120, the seal rings 160 can protect the inside of the chips 400 and prevent stress, which is induced by the dicing process, from transferring from the scribed-line region 120 into the inside of the chips 400. Therefore, elements and circuit structures inside of the chips 400 can be prevented from being damaged. In addition, the seal rings 160 can also protect the device regions from being affected by the outer environment. For example, the seal rings 160 facilitate blocking moisture or contaminants from getting into the chip package. In one embodiment, the width of the bridge portions 150, i.e. the width W of the subsequently formed protruding portions 410, is less than the distance D between the edge 401 of the chip 400 and the seal ring 160, as shown in FIG. 1D.

According to the aforementioned embodiments, the second substrate 100 is etched using the patterned mask layer 300 so as to form the first openings 130 in the scribed-line region 120 without penetrating the second substrate 100 and form the second openings 140 in the scribed-line region 120 to penetrate the second substrate 100. As a result, the second substrate 100 is separated into the plurality of chips 400 and the remaining portions of the second substrate 100 under the first openings 130 form the bridge portions 150 between the adjacent chips 400. Thermal conduction paths can be formed during the subsequent deposition process by the bridge portions 150 connecting the adjacent chips 400 to each other, such that the thermal conduction between the chips 400 is great and uniform. Therefore, the thickness of the insulating layer, which is subsequently deposited on the chips 400, is uniform and can be prevented from being reduced. Thus, the method for forming a chip package according to the aforementioned embodiments is capable of eliminating the problem of vacuum gaps, which are formed between portions of the wafer and the pins of the deposition equipment and cause poor thermal conduction, thereby improving the quality of the chip packages.

Next, referring to FIG. 1D, after forming the described insulating layer, the method for forming a chip package further comprises performing a dicing process along the scribed-line region 120. The bridge portions 150 between the adjacent chips 400 and the first substrate 200 are cut to completely separate every chip 400, and protruding portions 410 are formed at the corners of each chip 400 and extend outward.

In one embodiment, there are two protruding portions 410 formed at each corner of the chip 400. The two protruding portions 410 respectively extend outward along two edges of the respective corner, and are perpendicular to each other. The width W of the protruding portions 410 is less than the distance D between the edge 401 of the chip 400 and the seal ring 160. In one embodiment, the protruding portions 410 have a rectangular top-view contour. It should be realized that the number, top-view contour and position of the protruding portions 410 shown in FIG. 1D are illustrated as an example and they are not limited thereto. The actual number, top-view contour and position of the protruding portions 410 are determined by design demands.

Figure 3A:
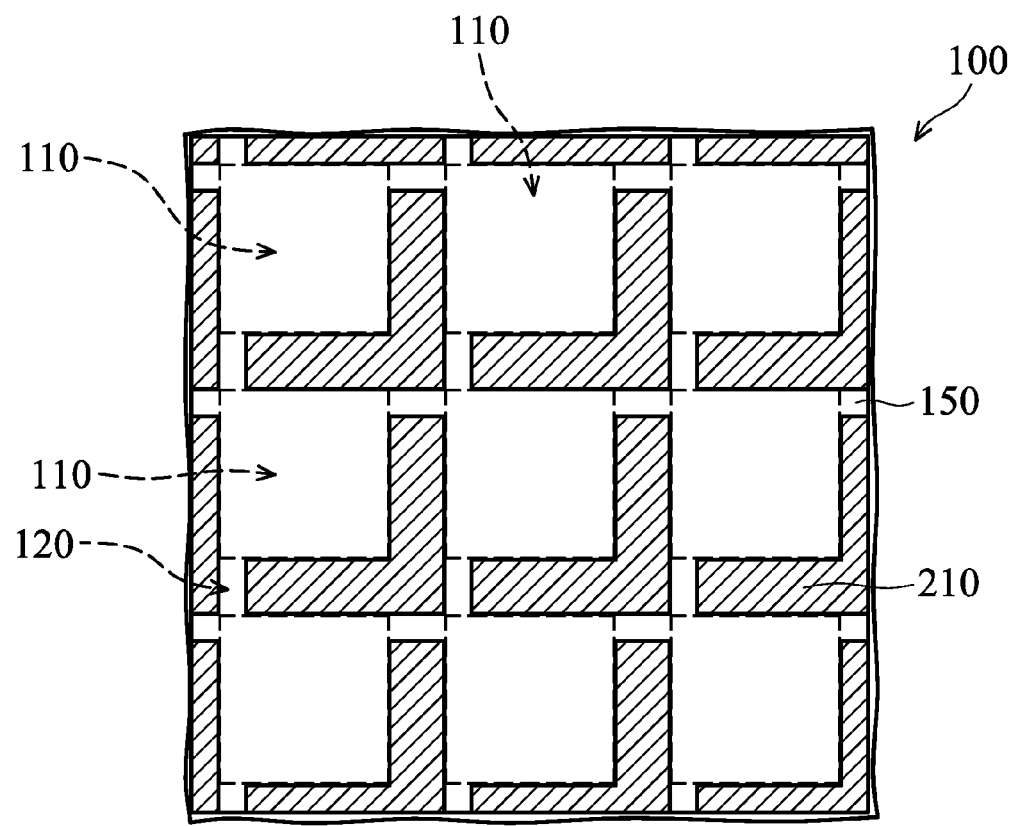
FIGS. 3A, 4A and 5A are plan views of various exemplary embodiments of a chip package having bridge portions according to the invention.
Figure 3B:
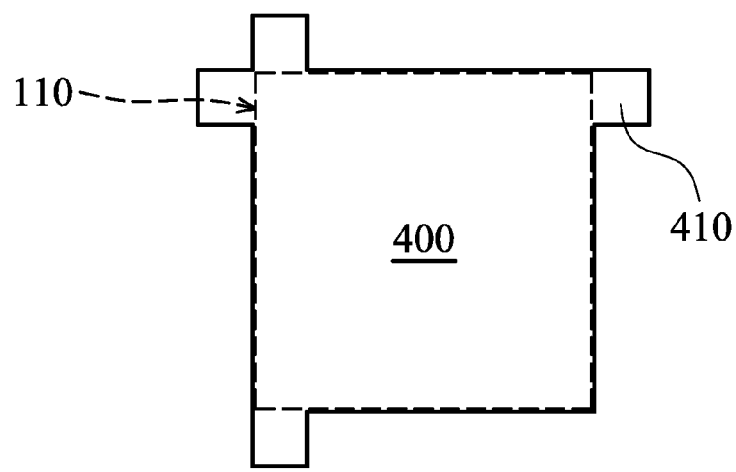
FIGS. 3B, 4B and 5B are plan views of various exemplary embodiments of a chip package having protruding portions according to the invention.

Referring to FIGS. 3A and 3B, plan views of another exemplary embodiment of bridge portions and the respective protruding portions of a chip package according to the invention are illustrated, wherein elements in FIGS. 3A and 3B that are the same as those in FIGS. 1C and 1D are labeled with the same reference numbers as in FIGS. 1C and 1D and are not described again, for brevity. The chip package structure shown in FIG. 3A is similar to that shown in FIG. 1C. The difference therebetween is that the chip package structure shown in FIG. 3A comprises only one bridge portion 150 disposed between the adjacent rectangular chips 400 in the same column, and only one bridge portion 150 disposed between the adjacent chips 400 in the same row as well. Namely, two edges of each chip 400 connect to different bridge portions 150 and each edge of each chip 400 connects to only one bridge portion 150.

The chip package structure shown in FIG. 3B is similar to that shown in FIG. 1D. The difference therebetween is that the rectangular chip 400 shown in FIG. 3B comprises two protruding portions 410 perpendicular to each other at only one corner thereof. Moreover, there is no protruding portion 410 at another corner, which is located on the same diagonal line as the described corner, while there is only one protruding portion 410 at the other two corners of the chip 400.

Figure 4A:
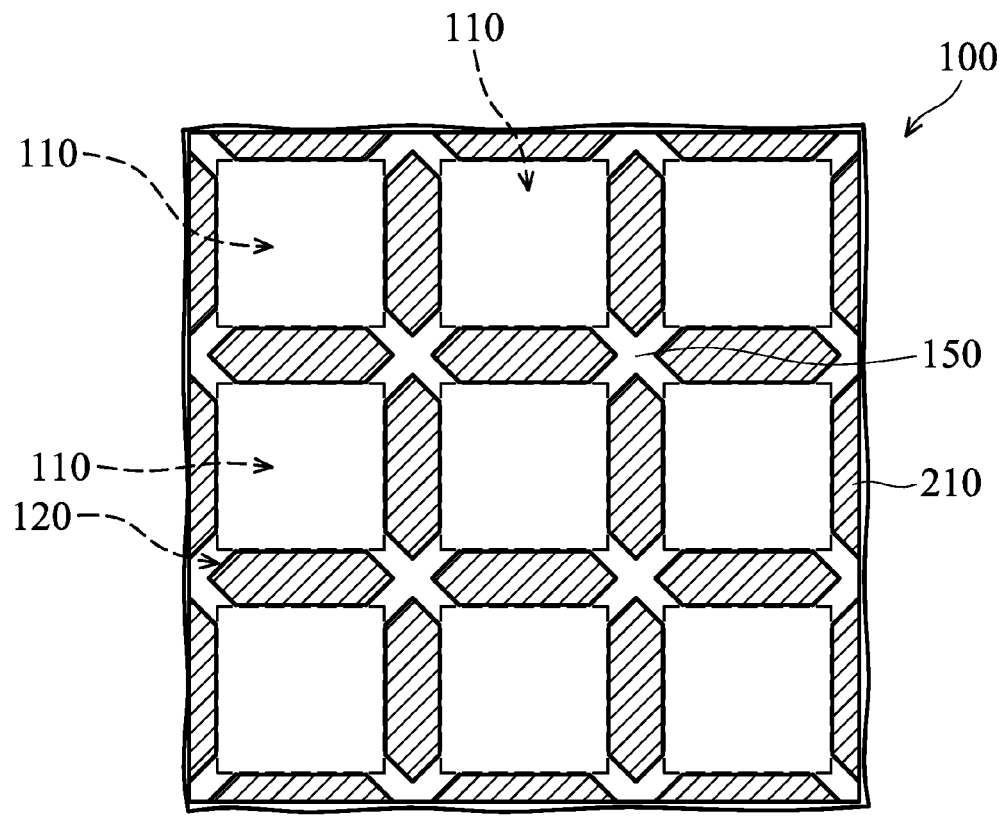
Figure 4B:
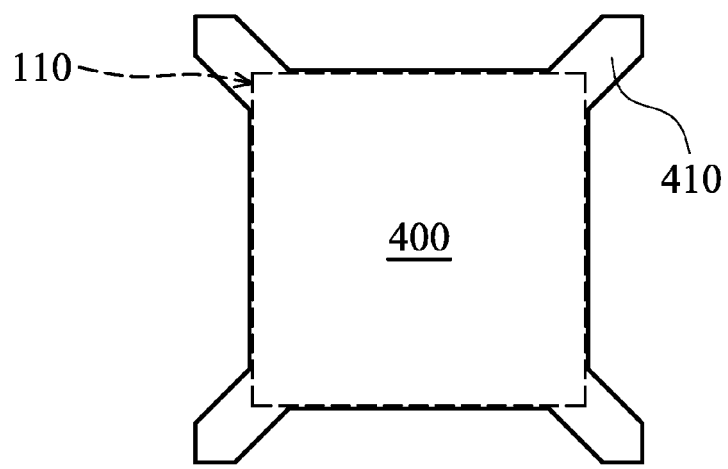

Referring to FIGS. 4A and 4B, plan views of yet another exemplary embodiment of bridge portions and the respective protruding portions of a chip package according to the invention are illustrated, wherein elements in FIGS. 4A and 4B that are the same as those in FIGS. 1C and 1D are labeled with the same reference numbers as in FIGS. 1C and 1D and are not described again, for brevity. The chip package structure shown in FIG. 4A is similar to that shown in FIG. 1C. The difference therebetween is that the chip package structure shown in FIG. 4A comprises a plurality of bridge portions 150, which connects to the adjacent four chips 400, in the adjacent two rows or columns. Namely, each bridge portion 150 connects to the corners of the adjacent four chips 400. In other words, each corner of the chip 400 connects to another corner of another chip 400, which is located in an extending direction of the diagonal line of the chip 400, by the bridge portion 150 extending along the extending direction of the same diagonal line of the chip 400.

The chip package structure shown in FIG. 4B is similar to that shown in FIG. 1D. The difference therebetween is that the rectangular chip 400 shown in FIG. 4B comprises only one protruding portion 410 at each corner thereof. The protruding portion 410 extends along an extending direction of the diagonal line of the chip 400 and has a polygonal top-view contour.

Figure 5A:
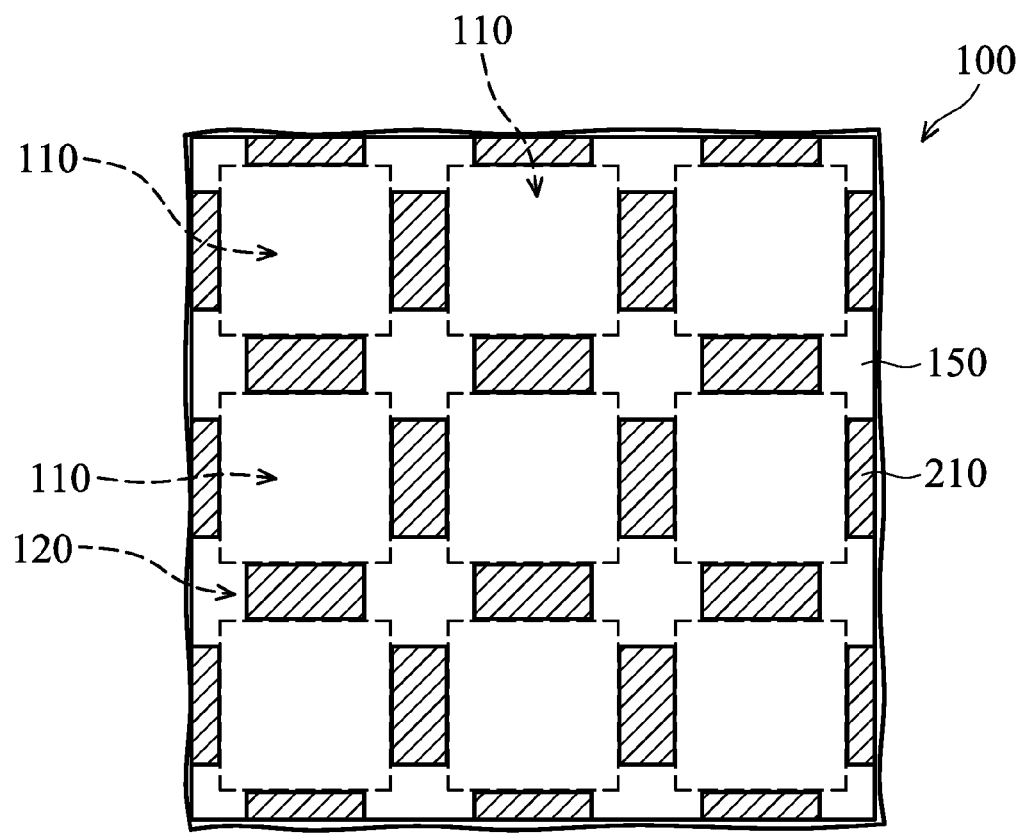
Figure 5B:
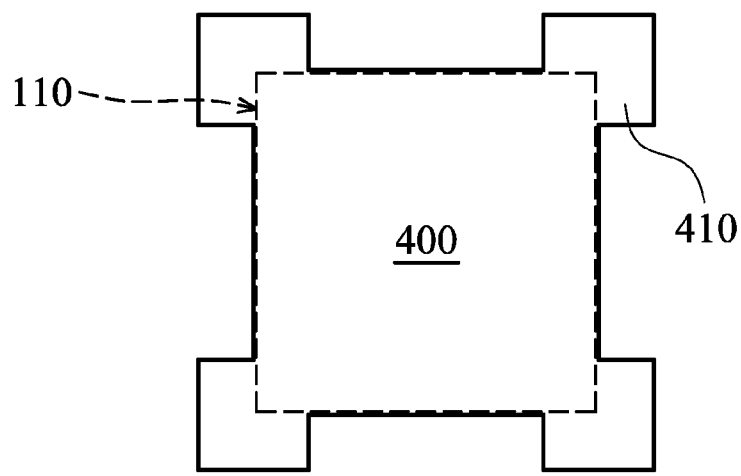

Referring to FIGS. 5A and 5B, plan views of yet another exemplary embodiment of bridge portions and the respective protruding portions of a chip package according to the invention are illustrated, wherein elements in FIGS. 5A and 5B that are the same as those in FIGS. 4A and 4B are labeled with the same reference numbers as in FIGS. 4A and 4B and are not described again, for brevity. The chip package structure shown in FIG. 5A is similar to that shown in FIG. 4A. The difference therebetween is that the bridge portions 150 shown in FIGS. 4A and 5A have different polygonal top-view contours. Moreover, each bridge portion 150 shown in FIG. 5A extends to the corners of three adjacent chips 400 along an extending direction of the diagonal line of the respective chip 400 and the other two directions, which are respectively perpendicular to two edges of the respective chip 400. In other words, each corner of each chip 400 shown in FIG. 5A not only connects to another corner of another chip 400, which is located in the extending direction of the diagonal line of the chip 400, by the bridge portion 150 extending along the extending direction of the same diagonal line of the chip 400, but also connects to corners of two other chips 400 by the bridge portion 150 further extending along two other directions, which are respectively perpendicular to two edges of the chip 400.

The chip package structure shown in FIG. 5B is similar to that shown in FIG. 4B. The difference therebetween is that the bridge portions 150 shown in FIGS. 4B and 5B have different polygonal top-view contours. Moreover, the protruding portion 410 at each corner of the chip 400 extends outward along not only the extending direction of the diagonal line but also the other two directions perpendicular to the two edges of the chip 400.

Instead of a two-stage dicing step, which comprises dicing the second substrate 100 into a plurality of rectangular chips and then dicing the first substrate 200, according to the aforementioned embodiments, the second substrate 100 is etched using the patterned mask layer 300 so as to form the plurality of chips 400 and at least one bridge portion 150 between the adjacent chips 400. The first substrate 200 is then diced, such that the adjacent chips 400 connect to each other by the bridge portions 150. As a result, the thermal conduction between the chips 400 is great and uniform. Therefore, the thickness of the insulating layer deposited on the chips 400 is uniform, thereby improving the quality of the chip packages.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
   providing a first substrate;
   attaching a second substrate on the first substrate, wherein the second substrate has a plurality of rectangular chip regions separated by a scribed-line region; and removing a portion of the second substrate corresponding to the scribed-line region to form a plurality of chips on the first substrate, wherein at least one bridge portion is formed between adjacent chips of the plurality of chips.

2. The method as claimed in claim 1, wherein a plurality of bridge portions is formed between adjacent chips of the plurality of chips, such that at least one edge of each of the adjacent chips connects to the plurality of bridge portions.

3. The method as claimed in claim 1, wherein a plurality of bridge portions is formed between adjacent chips of the plurality of chips, such that at least one corner of each of the adjacent chips connects to the plurality of bridge portions.

4. The method as claimed in claim 1, wherein the at least one bridge portion connects to a corner of each of four chips.

5. The method as claimed in claim 1, wherein a thickness of the at least one bridge portion is less than that of the second substrate.

6. The method as claimed in claim 1, wherein each chip comprises a seal ring, and a width of the at least one bridge portion is less than a distance between an edge of each chip and a corresponding seal ring.

7. The method as claimed in claim 1, further comprising cutting the at least one bridge portion, such that each chip corresponding to the at least one bridge portion comprises a protruding portion.

8. The method as claimed in claim 7, wherein the protruding portion is located at a corner of a corresponding chip, and extends outward along a direction of a diagonal line or at least one edge of the corresponding chip.

9. The method as claimed in claim 7, wherein the protruding portion has a rectangular or polygonal top-view contour.

10. A chip package, comprising:
   a first substrate; and
   a plurality of chips attached on the first substrate, wherein at least one bridge portion is disposed between adjacent chips of the plurality of chips.

11. The chip package as claimed in claim 10, wherein a plurality of bridge portions is disposed between adjacent chips of the plurality of chips, such that at least one edge of each of the adjacent chips connects to the plurality of bridge portions.

12. The chip package as claimed in claim 10, wherein a plurality of bridge portions is disposed between adjacent chips of the plurality of chips, such that at least one corner of each of the adjacent chips connects to the plurality of bridge portions.

13. The chip package as claimed in claim 10, wherein the at least one bridge portion connects to a corner of each of four chips.

14. The chip package as claimed in claim 10, wherein a thickness of the at least one bridge portion is less than that of the plurality of chips.

15. The chip package as claimed in claim 10, wherein each chip comprises a seal ring, and a width of the at least one bridge portion is less than a distance between an edge of each chip and a corresponding seal ring.

16. A chip package, comprising:
   a rectangular chip having a corner and at least one protruding portion extending outward from the corner of the rectangular chip.

17. The chip package as claimed in claim 16, wherein the at least one protruding portion extends outward along a direction of a diagonal line or at least one edge of the chip.

18. The chip package as claimed in claim 16, wherein the at least one protruding portion has a rectangular or polygonal top-view contour.

19. The chip package as claimed in claim 16, wherein a thickness of the at least one protruding portion is less than that of the chip.

20. The chip package as claimed in claim 16, wherein the chip comprises a seal ring, and a width of the at least one protruding portion is less than a distance between an edge of the chip and the seal ring.

* * * * *